United States Patent

Walker et al.

[11] Patent Number: 4,697,001
[45] Date of Patent: Sep. 29, 1987

[54] CHEMICAL SYNTHESIS OF CONDUCTING POLYPYRROLE

[75] Inventors: John A. Walker, Los Angeles; Edward F. Witucki, Van Nuys; Leslie F. Warren, Camarillo, all of Calif.

[73] Assignee: Rockwell International Corporation, El Segundo, Calif.

[21] Appl. No.: 916,917

[22] Filed: Oct. 9, 1986

Related U.S. Application Data

[63] Continuation-in-part of Ser. No. 646,717, Sep. 4, 1984, Pat. No. 4,617,228, and a continuation-in-part of Ser. No. 883,202, Jul. 8, 1986, and a continuation-in-part of Ser. No. 883,260, Jul. 8, 1986.

[51] Int. Cl.$^4$ .................. C07D 207/30; C08G 73/20; H04B 1/12
[52] U.S. Cl. .................... 528/423; 252/500; 252/519; 427/121; 428/268; 526/258
[58] Field of Search ............... 252/500, 519; 427/121; 528/423; 428/268; 526/258

[56] References Cited

U.S. PATENT DOCUMENTS

| | | | |
|---|---|---|---|
| 4,487,667 | 12/1984 | Traynor | 528/423 X |
| 4,567,250 | 1/1986 | Naarmann et al. | 528/423 |
| 4,585,695 | 4/1986 | Ogasawara et al. | 252/500 X |

Primary Examiner—Michael R. Lusignan
Attorney, Agent, or Firm—Charles T. Silberberg; Max Geldin

[57] ABSTRACT

Production of electrically conductive polypyrrole of enhanced stability by treating a liquid pyrrole with a solution of a strong oxidant, capable of oxidizing pyrrole to a pyrrole polymer, and oxidizing the pyrrole by such strong oxidant in the presence of a relatively large organic dopant anion, and precipitating a conductive polypyrrole. The strong oxidant, e.g., $Fe^{3+}$ ion, and dopant anion, which can be an alkyl or aryl sulfonate, e.g., methylbenzenesulfonate, or a perfluorinated carboxylate, e.g., trifluoroacetate, anion, can be derived from a single compound, e.g.,

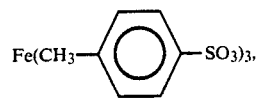

the anion serving as dopant for the polypyrrole.

21 Claims, 1 Drawing Figure

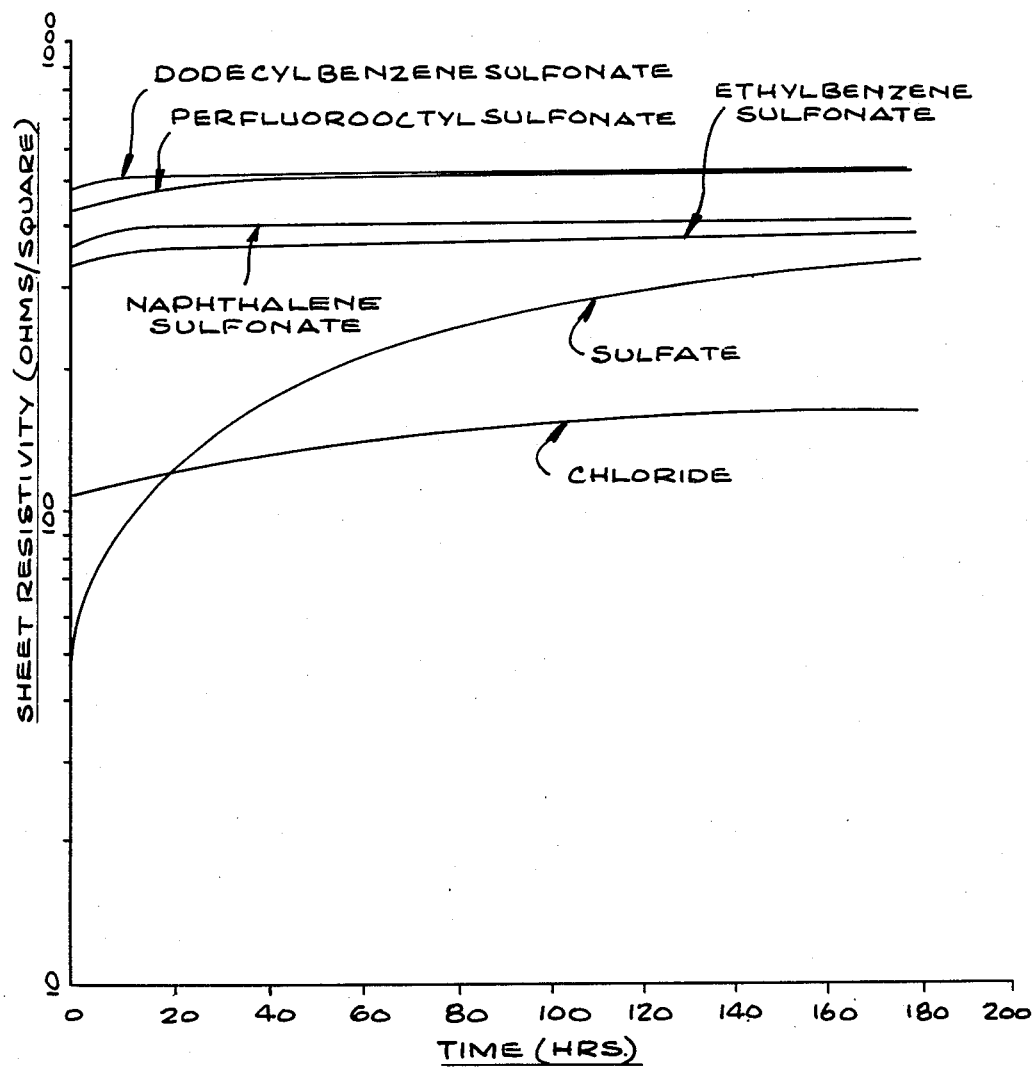

CHEMICAL SYNTHESIS OF CONDUCTING POLYPYRROLE

BACKGROUND OF THE INVENTION

This application is a continuation-in-part of U.S. application Ser. Nos. 646,717 filed Sept. 4, 1984 now U.S. Pat. No. 4,617,228; 883,202 filed July 8, 1986; and 883,260 filed July 8, 1986.

The present invention relates to the production of electrically conductive polypyrrole and is particularly concerned with a process for converting pyrroles to conductive polypyrrole using chemical prodedure including the use of dopant ions which confer a wide range of electrical conductivities on the polypyrrole.

Polypyrrole represents one of the most environmentally stable conducting organic polymers. Its usual preparation has involved electrochemical oxidation of pyrroles in various solvents, with films of the conducting materials depositing on the anode. U.S. Pat. Nos. 4,552,927 to L. F. Warren and 4,582,575 to L. F. Warren, et al., are illustrative of the production of conductive polypyrrole produced in thicker layers and having improved mechanical properties, such as flexibility, as compared to prior art electrochemically produced polypyrrole films.

Polypyrrole prepared by chemical procedures is disclosed in the above co-pending applications, of which the present application is a continuation-in-part.

U.S. Pat. No. 4,567,250 to Naarmann, et al., discloses preparation of electrically conductive pyrrole polymers by a chemical process in which the pyrroles in solution and in the presence of a conductive salt, such as $KAlF_3$, are treated with an oxygen-containing oxidizing agent, such as $K_2S_2O_8$.

Chemically prepared pyrrole has several distinct advantages over electrochemically prepared polypyrrole, especially concerning its potential use commercially. Thus, chemically prepared polypyrrole is much more amenable to scale-up and commercial plant equipment. It also is considerably easier to apply to a substrate or structural material which would then be used in fabricating an end product.

An object of the present invention is the provision of a process for producing electrically conductive polypyrrole having a selective conductivity, by chemical procedure.

Another object is to provide procedure for producing electrically conductive polypyrroles having a wide range of conductivities, which can be used in the production of conductive structural materials.

Yet another object is to provide a process for producing conductive polypyrroles which are stable at elevated temperature and which have prolonged shelf stability.

A still further object is the provision of novel electrically conductive pyrrole polymers produced by the above process.

SUMMARY OF THE INVENTION

The above objects are achieved, according to the invention, by reacting a pyrrole, e.g., pyrrole or a derivative thereof, e.g., its N-substituted derivative, with a strong oxidant, in the presence of certain dopant ions varying in size and ionicity.

A suitable oxidization agent is, for example, the ferric ion, the reduced species of which may remain soluble and/or separable from the precipitated polymer, following the reaction. The oxidant counterion, which is the essential feature of the present invention, can be an alkyl or aryl sulfonate, or a fluorinated carboxylate, and is incorporated in the polymer as the dopant. Thus, in one example, ferric methylbenzenesulfonate can be treated with pyrrole, resulting in a precipitate of conductive polypyrrole.

By suitable selection of the particular alkyl or aryl sulfonate dopant anion, or fluorinated carboxylate dopant anion, as described in greater detail hereinafter, the use of the above classes of dopant anions permits a choice of a wide range of conductivities in the resulting conductive polypyrrole.

The resulting conductive polypyrrole in powder form can be incorporated as suspensions in various matrices, e.g., epoxy, or encapsulated therein, and subsequently used as semi-conducting structural materials.

Further, the resulting conductive polypyrrole can be impregnated into a dielectric substrate and such conductive substrate applied as conductive composite structural materials.

These and other objects and features of the invention will become apparent from the following detailed description thereof.

DESCRIPTION OF THE INVENTION AND THE PREFERRED EMBODIMENTS

The liquid pyrrole treating solution can comprise neat liquid pyrrole, a C-substituted pyrrole, such as a 3- or 3,4- alkyl or aryl substituted pyrrole, e.g., 3-methylpyrrole, 3,4-dimethylpyrrole, 3-phenylpyrrole or 3-methyl-4-phenylpyrrole, an N-substituted pyrrole, e.g., an N-alkylpyrrole, such as N-methylpyrrole, or an N-arylpyrrole, such as N-phenylpyrrole, or a substituted N-phenylpyrrole, such as nitrophenylpyrrole, to obtain the corresponding conductive pyrrole homopolymer. For production of a conductive copolymer, a mixture of pyrrole and a C- or an N-substituted derivative of pyrrole, as described above, can be employed. The use of substituted pyrroles generally results in lower conductivity polymers than the parent polypyrrole. Hence, the use of pyrrole is preferred for higher conductivity applications.

The oxidation of pyrrole or a substituted derivative thereof to produce the conductive pyrrole polymer is carried out in the presence of a strong oxidant. The term "strong oxidant" as employed herein is intended to denote any oxidizating substance which is capable of oxidizing pyrrole or a substituted derivative thereof, as defined above, to produce polypyrrole or a pyrrole copolymer.

Examples of strong oxidants include the cations $Fe^{3+}$, $Cu^{2+}$, $Ce^{4+}$ and $(C_6H_5)_3C^+$.

According to the invention, a material providing certain substantially non-nucleophilic anions functioning as dopant anions for the pyrrole polymer is also employed, preferably in conjunction with the oxidant. These anions are organic anions, particularly alkyl or aryl sulfonates. The alkyl sulfonates can contain alkyl groups of from 1 to about 18 carbon atoms, and such alkyl groups can be unsubstituted or substituted, e.g., by halogen, such as chlorine or fluorine atoms. The aryl groups can be benzene, naphthalene, and the like, and such aryl groups can be unsubstituted or substituted, e.g., by alkyl groups, such as methyl, ethyl, and the like.

Other dopant anions which can be employed according to the invention are fluorinated carboxylates, particularly perfluorinated acetates and perfluorinated butyrates.

Although the oxidant as cation and the non-nucleophilic or dopant anion can be provided by separate compounds, a convenient manner for providing both the strong oxidant and dopant anion is in the form of a salt incorporating both the oxidant cation and the dopant anion, as oxidant counterion.

Examples of sulfonate and perfluorinated carboxylate dopant anions and their ferric salts which can be employed according to the invention are shown in Table I below.

TABLE I

| anion | ferric salt |
| --- | --- |
| 1. trifluoroacetate | $Fe(CF_3CO_2)_3$ |
| 2. perfluorobutyrate | $Fe(CF_3CF_2CF_2CO_2)_3$ |
| 3. methylsulfonate | $Fe(CH_3SO_3)_3$ |
| 4. trifluoromethylsulfonate | $Fe(CF_3SO_3)_3$ |
| 5. perfluorooctylsulfonate | $Fe[CF_3(CF_2)_7SO_3]_3$ |
| 6. methylbenzenesulfonate | $Fe(CH_3-C_6H_4-SO_3)_3$ |
| 7. ethylbenzenesulfonate | $Fe(C_2H_5-C_6H_4-SO_3)_3$ |
| 8. dodecylbenzenesulfonate | $Fe[CH_3(CH_2)_{11}-C_6H_4-SO_3]_3$ |
| 9. naphthalenesulfonate | $Fe(C_{10}H_7-SO_3)_3$ |

In place of the above ferric salts, it will be understood that the corresponding salts of other cations, e.g., the cupric or ceric salts, can be utilized.

The sulfonate dopant anions are preferred over the perfluorinated carboxylate anions, since polypyrrole produced employing the sulfonates has substantially higher electrical conductivity than polypyrrole produced utilizing the perfluorinated carboxylates, as noted below. However, in certain instances, polypyrrole materials having relatively low electrical conductivity are sometimes desired for certain applications. When employing either the alkyl or aryl sulfonate, an important advantage achieved according to the invention is substantially improved stability at elevated temperature and shelf-life stability of the resulting polypyrrole containing the large dopant anions of the invention, as compared to polypyrrole materials containing the much smaller dopant anions, such as sulfate or chloride anions, of the prior art.

The reaction is generally carried out in a suitable solvent. The solvents used can be any organic solvent in which pyrrole and the oxidant or oxidant salt are soluble and which does not interfere with the desired oxidation reaction. Such solvents include alcohols, e.g., methanol, ethers, e.g., dioxane and tetrahydrofuran (THF), acetone, acetonitrile, tetrahydrofuran, methylene chloride, and the like. Water, alone or in combination with a water miscible or immiscible solvent, also can be employed. The solvent can be initially present in the oxidant or oxidant salt, or in the pyrrole solution, or both.

The concentration of the pyrrole in the solvent, when used, can vary but, generally, is in the range from about 0.03 to about 2 molar.

The concentration of oxidant material or cation in aqueous or solvent solution can range from about 0.001 to about 2 molar, preferably about 0.5 molar, and the concentration of non-nucleophilic or dopant anion or anion-producing material also can range from about 0.001 to about 2 molar, e.g., about 1 molar.

The reaction is conveniently carried out by slowly adding the liquid pyrrole, e.g., dropwise, to the oxidant or oxidant salt solution with stirring. A black precipitate forms almost immediately, and continues to form until addition of the pyrrole is complete. The reaction mixture is then stirred for a period of time, e.g., for 15 minutes or more, to assure completeness of reaction.

The reaction mixture is then filtered and the solid washed, e.g., with water or methanol. The dry polypyrrole powder is comprised of a pyrrole polymer cation and one of the above anions as dopant. Elemental analysis obtained on these novel polymers indicate approximately one anion for each 2–7 pyrrole units, with an average dopant concentration of about one anion for each 4 pyrrole units.

The following are specific examples of practice of the invention for obtaining conductive polypyrrole employing the anion doping agents of the invention:

EXAMPLE I

A. Preparation of Ferric Ethylbenzenesulfonate

Ferric hydroxide was prepared by slowly adding a solution of 44.1 g (1.11 mol) NaOH dissolved in 300 ml of $H_2O$ to a solution of 100 g (0.370 mol) $FeCl_3.6\ H_2O$ dissolved in 1400 ml of $H_2O$ with vigorous stirring. After one hour, the entire reaction mixture was filtered through a 2000 ml medium fritted funnel. The amorphous brown solid was rinsed with 2×500 ml portions of $H_2O$.

The ferric hydroxide prepared as described above was suspended in 700 ml methanol. To this suspension was slowly added 207 g (1.05 mol) 95% ethylbenzenesulfonic acid dissolved in 300 ml methanol. The reaction mixture was then gently warmed to 50° C. with vigorous stirring for three hours. The orange-red solution was cooled to room temperature and filtered to remove any insoluble material. The filtrate was evaporated, and the remaining oil was placed in a crystallizing dish. The reaction product was further dried in a vacuum oven (50° C., 0.15 mm). The solid residue was pulverized into a finely divided powder (250 g) and stored in a tightly sealed container.

B. Reaction of Pyrrole with Ferric Ethylbenzenesulfonate

A solution of 20 g ferric ethylbenzenesulfonate in 20 ml methanol was prepared. To this rapidly stirred solution at 25° C. was added, via syringe, 1.0 g pyrrole. The reaction mixture rapidly darkened and produced a thick black suspension or gel of polymer. The polymer was isolated by filtration and rinsed with methanol until the yellow color of the ferric salt could not be visually detected. The polymer was then dried under a high vacuum yielding 1.08 g black pyrrole polymer. The conductivity of the polymer so prepared was 26.9 ohm$^{-1}$cm$^{-1}$. Repetition of this procedure at 0° C. produced a similar yield of polymer with a measured conductivity of 58 ohm$^{-1}$cm$^{-1}$.

EXAMPLE II

A. Preparation of Ferric Perfluorooctylsulfonate

Ferric hydroxide was prepared in the manner noted in Example I with 50.0 g FeCl$_3$.6H$_2$O (0.185 mol) and 22.19 g NaOH (0.554 mol). This material was suspended in 600 ml methanol. To this brown suspension was added 277 g of perfluorooctylsulfonic acid. The mixture was stirred and warmed to 50° C. for three hours. The reaction mixture was then cooled and filtered through Celite. The solvent was evaporated, and then the remaining orange oil was further dessicated in a vacuum oven (40° C., 0.15 mm) for three days. The resultant yellow solid was then pulverized with a mortar and pestle. The overall yield was 260 g of ferric perfluorooctylsulfonate.

B. Reaction of Ferric Perfluorooctylsulfonate with Pyrrole

A solution of 12.5 g (0.0081 mol) ferric perfluorooctylsulfonate was prepared in 8 ml methanol. To this orange solution was added, via syringe, 0.25 g (0.0037 mol) pyrrole. A black solid material immediately formed in the solution. After stirring the suspension for 30 minutes, the black solid was collected and rinsed thoroughly with methanol. After drying the black polymer for 24 hours (50° C., 0.15 mm), it weighed 0.25 g. The conductivity of this material was determined to be 40–50 ohm$^{-1}$cm$^{-1}$.

EXAMPLE III

A. Preparation of Ferric Perfluorobutyrate

To 100 g (0.37 mol) of FeCl$_3$.6H$_2$O in 1000 mls of H$_2$O was added with good stirring 44.4 g (1.11 mol) of NaOH dissolved in 200 ml of H$_2$O. After this addition, the resulting brown slurry was stirred an additional hour at room temperature. The gelatinous brown solid was filtered and washed well with H$_2$O. While still slightly wet, it was added spatula-wise to 237.5 g (1.11 mol) of perfluorobutyric acid in 500 mls of methanol. With good stirring, the resulting reaction mixture was heated gently to 50° C.; a clear solution resulted. It was filtered hot and cooled to room temperature. The solvent was removed via a Rinco evaporator yielding 250 g of ferric perfluorobutyrate.

B. Reaction of Pyrrole with Ferric Perfluorobutyrate

The reaction of ferric perfluorobutyrate with pyrrole was carried out substantially as in Example IB, resulting in a pyrrole polymer having a conductivity of 0.69 ohm$^{-1}$cm$^{-1}$.

EXAMPLE IV

A. Preparation of Ferric Trifluoroacetate

To 100 g (0.37 mol) of FeCl$_3$.6H$_2$O in 1000 mls of H$_2$O was added with good stirring 44.4 g (1.11 mol) of NaOH dissolved in 200 ml of H$_2$O. After this addition, the resulting brown slurry was stirred an additional hour at room temperature. The gelatinous brown solid was filtered and washed well with H$_2$O. While still slightly wet, it was added spatula-wise to 126.5 g (1.11 mol) of trifluoroacetic acid in 500 mls of methanol. With good stirring, the resulting reaction mixture was heated gently to 50° C.; a clear solution resulted. It was filtered hot and cooled to room temperature. The solvent was removed via a Rinco evaporator yielding 146 g of ferric trifluoroacetate.

B. Reaction of Pyrrole with Ferric Trifluoroacetate

The reaction of ferric trifluoroacetate with pyrrole was carried out substantially as in Example IB, resulting in a pyrrole having a conductivity of 3.58 ohm$^{-1}$cm$^{-1}$.

Electrically conductive composites containing electrically conductive polypyrrole produced according to the invention can also be prepared by inpregnating a porous substrate, such as a fabric, e.g., fiberglass fabric, with a conductive polypyrrole material produced according to the invention. In such process, a porous dielectric or electric insulating material can be used as substrate, such as a porous ceramic, a porous glass, e.g., a frit, a porous organic foam, e.g., polyurethane, a fabric, which can be woven or non-woven, e.g., fiberglass fabric, a mixed oxide fabric, such as an alumina-silica-boria fabric, e.g., Nextel, or a synthetic organic fabric, such as Kevlar, a trademark of the DuPont Company for aromatic polyamide fiber, a polyester, such as Dacron cloth, and the like.

Such conductive polypyrrole composites can be produced by contacting the dielectric porous substance with a liquid pyrrole, contacting the porous substance with a solution of a strong oxidant capable of oxidizing pyrrole to a pyrrole polymer, as described above, and oxidizing the pyrrole in the presence of a substantially non-nucleophilic or dopant anion, as described above, and precipitating a conductive pyrrole polymer, according to the invention, in the pores of said substance.

The liquid pyrrole can comprise neat liquid pyrrole or a C-substituted pyrrole, as noted above. Such pyrrole materials may or may not be contained in a solvent, such as alcohols, dioxane and acetonitrile. Water also can be employed.

The oxidant and the non-nucleophilic or dopant anion can be provided by the same compound, e.g., as in ferric ethylbenzenesulfonate, as noted above. In preferred practice, the dopant anion is present in the oxidant solution.

The time of treatment of the porous substrate in the pyrrole and oxidant solutions is long enough to penetrate the interstices of the porous material with the liquid pyrrole and to obtain sufficient penetration of the oxidant solution therein, to permit the precipitation reaction to occur in the interstices. The polypyrrole which is thus chemically precipitated remains within the interstices of the dielectric porous material after washing and drying thereof.

If desired, the porous substrate can be treated first with the oxidant solution containing dopant counterion, followed by treatment of the substrate containing the oxidant solution in the interstices thereof, with a liquid pyrrole or pyrrole solution.

The above-described chemical process for impregnating conductive polypyrrole into a substrate to produce conductive composite materials is described in above-noted U.S. application Ser. No. 646,717, and is incorporated herein by reference.

The following is an example of impregnation of polypyrrole produced according to the invention, into an insulating substrate:

EXAMPLE V

Two solutions were necessary for the treatment. The first solution was made up of 20 gms of ferric ethylbenzenesulfonate in 200 mls of acetone; the second solution consisted of 4 ml of pyrrole in 200 mls of pentane.

An insulating substrate, fiberglass, was dipped first into the ferric salt solution, dried, and then dipped into the pyrrole solution and again dried. The time interval for each dipping was 5-10 minutes. Dipping in both solutions can be considered one cycle. Conductivity can be varied with the number of cycles.

The varying conductivities of polypyrrole produced according to the invention employing the dopant anions hereof are shown by the following example:

EXAMPLE VI

Conductive polypyrrole powders were prepared according to the procedure described above utilizing the ferric salts of each of the dopant ions 1 to 9 of Table II below. Each of the polypyrrole powders thus produced was pressed into pellets from the neat solid, and the conductivity of such pellets was measured, the resulting conductivity data being set forth in the first column of Table II.

Polypyrrole composites were also produced by impregnating a fiberglass substrate with polypyrrole utilizing the procedure described above in Example V, employing the ferric salts of each of the dopant ions 1 to 9 of Table II, and the sheet resistivity of the respective impregnated dielectric substrates was measured in terms of ohms/square. The term "ohms/square" is defined as the bulk resistivity of the sample in ohms×cm divided by the thickness in cm. Sheet resistivity is proportional to the reciprocal of electrical conductivity.

TABLE II

| Dopant Ion | Conductivity of Pellets (ohm$^{-1}$ cm$^{-1}$) | Sheet Resistivity of Impregnated Dielectric Substrate ($\Omega/\square$) |
| --- | --- | --- |
| 1. trifluoromethylsulfonate | 61.8 | 90 |
| 2. methylbenzenesulfonate | 49.2 | 70 |
| 3. perfluorooctylsulfonate | 42.4 | 200 |
| 4. methylsulfonate | 35.5 | 174 |
| 5. naphthalenesulfonate | 28.0 | 230 |
| 6. ethylbenzenesulfonate | 26.9 | 212 |
| 7. dodecylbenzenesulfonate | 21.5 | 153 |
| 8. trifluoroacetate | 3.58 | 550 |
| 9. perfluorobutyrate | 0.69 | 1090 |

It is seen from Table II above that the use of the dopant anions of the invention produces polypyrroles having a wide range of conductivities, the higher conductivities being afforded by the sulfonate anions and the lower conductivities by the perfluorinated carboxylates. This permits one to choose the particular dopant to provide the exact conductivity required for a particular use.

The following example shows that the stability of polypyrrole is also affected by the dopant ion used.

EXAMPLE VII

Polypyrrole composites were prepared by impregnating a fiberglass substrate with polypyrrole utilizing the procedure described above in Example V, employing the ferric salts of each of the dopant ions of Table III below, and the sheet resistivity was measured at various intervals of time over a seven-day period at 350° F., and the results were plotted as shown in the drawing.

Also, the shelf life at ambient temperature of such composites was determined by measuring the sheet resistivity thereof over a period of several months, and the results are set forth in the data shown in Table III below:

TABLE III

| | Resistivity ($\Omega/\square$) | | | | |
| --- | --- | --- | --- | --- | --- |
| | Total Time (Months) | | | | |
| Dopant Ion | 0 | 1 | 2 | 3 | % Change |
| sulfate | 371 | 633 | 699 | 773 | 108 |
| chloride | 438 | 817 | 1347 | 1991 | 355 |
| ethylbenzenesulfonate | 339 | 360 | 423 | 423 | 25 |
| dodecylbenzenesulfonate | 670 | 810 | 1075 | 1075 | 60 |
| perfluorooctylsulfonate | 1243 | 1243 | 1347 | 1467 | 18 |
| naphthalenesulfonate | 410 | 438 | 527 | 548 | 34 |

From the plots shown in the drawing, it is seen that polypyrrole doped with either sulfate or chloride ions loses conductivity (gain in resistivity) over a seven-day period at 350° F. On the other hand, the use of the large dopant anions dodecylbenzenesulfonate, perfluorooctylsulfonate, ethylbenzenesulfonate, and naphthalenesulfonate all show substantially greater stabilities under these conditions.

Table III above shows that polypyrrole prepared from either sulfate or chloride anion loses substantially more conductivity (108% and 355%) change, respectively, over an extended time period, than the four larger sulfonate anions of the invention noted in Table III. It is believed that the enhanced stability of the resulting polypyrrole produced, according to the invention, is due to the larger size dopant anion, probably resulting in a molecular shielding of the polypyrrole backbone.

Electrically conductive polypyrrole and composites thereof produced according to the invention can be rendered even more stable against loss of conductivity by encapsulation using a suitable resin, such as an epoxy, as the encapsulating agent.

The encapsulation procedure comprises pre-pregging the conductive polymeric material or the porous substrate, e.g., fabric of the conductive composite, with the resin, e.g., epoxy, polyimide or bis-maleimide resin, and then curing the resulting system using conventional resin-curing techniques. The resulting encapsulated material or laminate has been shown to be stable electrically in a variety of environments. Such encapsulation procedure is described in U.S. application Ser. No. 883,253, filed July 8, 1986, of E. F. Witucki, L. F. Warren, Jr., and P. R. Newman, and assigned to the same assignee as the present application and is incorporated hereby by reference.

The conductive polypyrrole materials produced according to the invention have application as conductive composite structural materials, semi-conductor components, in anti-static applications, in electromagnetic interference shielding applications, and as electrical conductors.

From the foregoing, it is seen that the present invention provides improved chemical procedure for preparing novel electrically conductive polypyrrole having a wide range of conductivities and utilizing certain classes of dopant anions, such polypyrrole materials having good thermal stability and shelf life.

Since various changes and modifications will occur to and can be made readily by those skilled in the art without departing from the invention concept, the invention is not to be taken as limited except by the scope of the appended claims:

What is claimed is:

1. A process for producing electrically conductive polypyrrole which comprises:

treating a liquid pyrrole with a solution of a strong oxidant capable of oxidizing pyrrole to a pyrrole polymer, said strong oxidant being a cation selected from the group consisting of $Fe^{3+}$, $Cu^{2+}$, $Ce^{4+}$, and $(C_6H_5)_3C^+$ cations, oxidizing said pyrrole by said strong oxidant in the presence of a dopant anion selected from the group consisting of (1) alkyl and aryl sulfonates and (2) fluorinated carboxylates, and precipitating a conductive polypyrrole solid.

2. The process of claim 1, said pyrrole monomer selected from the group consisting of pyrrole, a 3- and 3,4-alkyl and aryl C-substituted pyrrole, an N-alkylpyrrole and an N-arylpyrrole.

3. The process of claim 1, said oxidant being present in a concentration in the range of about 0.001 to about 2 molar, and said dopant anion being present in a concentration in the range from about 0.001 to about 2 molar.

4. The process of claim 1, said dopant anion being selected from the class consisting of alkyl or aryl sulfonates.

5. The process of claim 4, said dopant anion being an alkyl sulfonate, the alkyl group having from 1 to about 18 carbon atoms.

6. The process of claim 4, said dopant anion being a benzenesulfonate or a naphthalenesulfonate.

7. The process of claim 1, said oxidant and said dopant anion being provided by a compound selected from the group consisting of the ferric salts of methylbenzenesulfonate, ethylbenzenesulfonate, dodecylbenzenesulfonate, perfluorooctylsulfonate, and naphthalenesulfonate.

8. The process of claim 1, said dopant anion being selected from the group consisting of the trifluoroacetate and perfluorobutyrate ions.

9. The process of claim 1, said oxidant and said dopant anion being provided by a compound selected from the group consisting of the ferric salts of trifluoroacetate and perfluorobutyrate.

10. The process of claim 1, the reaction being carried out in aqueous or organic solvent medium in which said pyrrole and said oxidant are soluble and which does not interfere with the oxidation reaction.

11. A process for producing electrically conductive polypyrrole which comprises:

contacting a pyrrole and a strong oxidant capable of oxidizing pyrrole to a pyrrole polymer, at substantially room temperature, in an aqueous or organic solvent medium in which said pyrrole and said oxidant are soluble and which does not interfere with the oxidation reaction, said strong oxidant being a cation selected from the group consisting of $Fe^{3+}$, $Cu^{2+}$, $Ce^{4+}$, and $(C_6H_5)_3C^+$ cations, oxidizing said pyrrole by said strong oxidant in the presence of a dopant anion selected from the group consisting of (1) alkyl and aryl sulfonates and (2) fluorinated carboxylates, and precipitating a conductive polypyrrole solid comprising a pyrrole polymer cation and said dopant anion.

12. The process of claim 11, said pyrrole being liquid pyrrole and said strong oxidant and said dopant anion being provided by a compound selected from the group consisting of the ferric salts of methylbenzenesulfonate, ethylbenzenesulfonate, dodecylbenzenesulfonate, perfluorooctylsulfonate, and naphthalenesulfonate.

13. A process for producing electrically conductive polypyrrole material which comprises:

contacting a porous substrate with liquid pyrrole, contacting said substrate containing said liquid pyrrole with a solution of a strong oxidant capable of oxidizing pyrrole to a pyrrole polymer, and oxidizing said pyrrole polymer in the presence of a dopant anion selected from the group consisting of (1) alkyl and aryl sulfonates and (2) fluorinated carboxylates, and precipitating a conductive pyrrole polymer in the pores of said substrate.

14. The process of claim 13, said oxidant and said dopant anion being provided by a compound selected from the group consisting of the ferric salts of methylbenzenesulfonate, ethylbenzenesulfonate, dodecylbenzenesulfonate, perfluorooctylsulfonate, and naphthalenesulfonate.

15. An electrically conductive polypyrrole produced by the process of claim 1.

16. An electrically conductive polypyrrole produced by the process of claim 7.

17. An electrically conductive polypyrrole produced by the process of claim 9.

18. An electrically conductive polypyrrole produced by the process of claim 12.

19. An electrically conductive polypyrrole produced by the process of claim 14.

20. An electrically conductive polypyrrole having a dopant anion selected from the group consisting of methylbenzenesulfonate, ethylbenzenesulfonate, dodecylbenzenesulfonate, perfluorooctylsulfonate, and naphthalenesulfonate, said polypyrrole having an average dopant concentration of about one anion for each four pyrrole units.

21. An electrically conductive polypyrrole having a dopant anion selected from the group consisting of the trifluoroacetate and perfluorobutyrate ions, said polypyrrole having an average dopant concentration of about one anion for each four pyrrole units.

* * * * *

UNITED STATES PATENT AND TRADEMARK OFFICE
CERTIFICATE OF CORRECTION

PATENT NO. : 4,697,001
DATED : September 29, 1987
INVENTOR(S) : John A. Walker, Edward F. Witucki, and Leslie F. Warren It is certified that error appears in the above-identified patent and that said Letters Patent is hereby corrected as shown below:

Claim 4, line 2, delete "or" and substitute therefor ---and---.

Signed and Sealed this

Fifteenth Day of March, 1988

*Attest:*

DONALD J. QUIGG

*Attesting Officer*     Commissioner of Patents and Trademarks